United States Patent
Toffoli et al.

(10) Patent No.: US 11,474,155 B2
(45) Date of Patent: Oct. 18, 2022

(54) METHOD FOR TESTING ONE OR A PLURALITY OF MICROBATTERY DEVICES, AND SYSTEM IMPLEMENTING THE TESTING METHOD

(71) Applicant: COMMISSARIAT A L'ENERGIE ATOMIQUE ET AUX ENERGIES ALTERNATIVES, Paris (FR)

(72) Inventors: Alain Toffoli, Grenoble (FR); Sami Oukassi, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 17/359,594

(22) Filed: Jun. 27, 2021

(65) Prior Publication Data
US 2022/0003821 A1    Jan. 6, 2022

(30) Foreign Application Priority Data
Jul. 1, 2020    (FR) ...................................... 2006930

(51) Int. Cl.
*G06F 11/30*    (2006.01)
*G01R 31/3835*    (2019.01)
(Continued)

(52) U.S. Cl.
CPC ..... *G01R 31/3835* (2019.01); *G01R 31/3648* (2013.01); *G01R 31/389* (2019.01); *H01M 10/4285* (2013.01)

(58) Field of Classification Search
CPC ................................................ G01R 31/3835
See application file for complete search history.

(56) References Cited

U.S. PATENT DOCUMENTS 6,526,361 B1 *   2/2003   Jones .................... G01R 31/386
                                                      702/182
9,209,496 B2 *  12/2015   Ro ............................ H01M 10/42

FOREIGN PATENT DOCUMENTS

CN        107 838 057 A      3/2018

OTHER PUBLICATIONS

Li, et al., "A comparative study of sorting methods for Lithium-ion batteries", 2014 IEEE Conference and Expo Transportation Electrification Asia-Pacific (ITEC Asia-Pacific), 2014.
(Continued)

*Primary Examiner* — Phuong Huynh
(74) *Attorney, Agent, or Firm* — BakerHostetler

(57) ABSTRACT

A method for testing at least one energy micro-storage device includes an anode made of metallic lithium formed by electrodeposition of ions on a metal inert to lithium ions, the method comprising a succession of steps during the manufacture of said anode: a step of measuring the initial voltage OCV of the energy micro-storage device; a first charging step, comprising applying a current, measuring the voltage and the internal resistance of the device in order to verify the compliance of the measurements on a very low lithium layer thickness formed at the anode; a second charging stabilization step, comprising applying a current and measuring the voltage of the device in order to verify the compliance of the measurements on a low lithium layer thickness formed at the anode; a retention step with a zero current applied and measuring the voltage in order to confirm the compliance of the energy micro-storage device. A system for implementing the method is also provided.

16 Claims, 3 Drawing Sheets

(51) Int. Cl.
  *G01R 31/389*    (2019.01)
  *G01R 31/36*     (2020.01)
  *H01M 10/42*     (2006.01)

(56)       References Cited

OTHER PUBLICATIONS

Collins, et al., "Fundamentals, impedance, and performance of solid-state LI-metal microbatteries", Journal of Vacuum Science & Technology, Part A, vol. 38, No. 2, 033212 (2020).

Aubert, et al., "Comment construire un diagramme de Henry avec Excel et comment l'interpréter", Revue MODULAD, 2006.

Neudecker, et al., "Lithium-Free Thin-Film Battery with In Situ Plated Li Anode", Journal of The Electrochemical Society, 147 (2), pp. 517-523, 2000.

\* cited by examiner

METHOD FOR TESTING ONE OR A PLURALITY OF MICROBATTERY DEVICES, AND SYSTEM IMPLEMENTING THE TESTING METHOD

CROSS-REFERENCE TO RELATED APPLICATIONS

This application claims priority to foreign French patent application No. FR 2006930, filed on Jul. 1, 2020, the disclosure of which is incorporated by reference in its entirety.

FIELD OF THE INVENTION

The field of the invention is that of the electrical testing of electronic or technological devices produced using microelectronics technology: integrated circuits, sensors, elementary devices (resistor, diode, capacitor, etc.).

BACKGROUND

More specifically, it involves an electrical testing method dedicated to a certain category of energy micro-storage components, commonly called microbatteries.

A microbattery is produced by successively depositing the following on a substrate: (i) first current collector, (ii) first electrode, (iii) electrolyte, (iv) second electrode and (v) second current collector. An encapsulation by way of depositing additional layers or by adding a cover is required in order to protect the device from chemical reactivity with oxygen and water vapour.

In general, microbatteries may be classified into three categories depending on the type of negative electrode (or anode), often deposited on top of the electrolyte:

anode made of $Li^+$ ion storage material: this often involves oxides of transition metals (Vox, TiOx, NiOx, etc.) or crystallogenic materials (Si, Ge, C or mixtures); anode made of metallic lithium: a lithium layer is deposited in metallic form on top of the collector;

anode made of metal inert to lithium: this configuration is often called "Li-free" with reference to the article *J. Electrochem. Soc.*-2000-Neudecker-517-23. In this case, an anode made of metallic lithium is formed during the first charging of the battery through electrodeposition of $Li^+$ ions (originating from the cathode) between the electrolyte and the second current collector.

The last configuration is the most advantageous in the case of integrating microbatteries on a silicon substrate and of using micro-manufacturing techniques: it offers the presence of lithium metal (the most effective anode due to its energy density, potential and cyclability) without the drawbacks associated with the presence thereof during the process (sensitivity to air, incompatibility with etching and photolithography solutions).

In general, the most commonly used and most reliable sorting and electrical testing protocol consists in (i) testing the microbattery over a plurality of complete charging and discharging cycles (changing from fully charged to fully discharged) and (ii) comparing the capacity values, the voltage profiles and the internal resistance with reference values.

This approach however has several limitations: in the context of microbatteries, and more particularly "Li-free" microbatteries, cycling leads to structural variations in the active stack, in this case the formation of metallic lithium, making it highly sensitive to air and difficult to reconcile in the technological manufacturing process.

In the case of larger batteries, applying this method remains highly rare in that it requires lengthy test periods, this representing a significant cost.

Sorting may be based on one or more parameters of the microbattery without having to cycle them. The most commonly used electrical parameters include the following:

the open-circuit voltage or OCV. This voltage corresponds to that measured at the microbattery at the end of manufacturing thereof and before any electrical operation thereon. It generally gives an idea as to the state of charge of the microbattery. This is verified for example in the case of microbatteries with an anode made of metallic lithium or a storage anode. In the case of "Li-free" microbatteries, it has been observed in experiments that the OCV had a significant variability within one wafer and from wafer to wafer, and that no correlation was possible between OCV and state of charge, as shown in FIG. 1, which illustrates the variations in the OCV for a microbattery component produced on a batch of 7 wafers. The variability is significant both within one wafer and from wafer to wafer.

The variability is linked to the fact that the anode made of lithium is no longer formed at this stage, and the OCV measurement gives information about the state of the electrolyte/electrode interfaces only, without any link to the state of charge or future electrical behaviour. As a result, this parameter is not relevant for establishing sorting of all of the microbattery configurations.

internal resistance: this corresponds to all of the resistive contributions taking place within the structure of the microbattery, and is the sum of the resistance of the electrolyte, the charge transfers in the electrodes and the interfaces. This parameter is not relevant for sorting in the case of "Li-free" microbatteries, for the same reason as that explained above, since the anode made of metallic lithium is not formed.

The challenge of sorting in this precise case is that of being able to have electrical parameters that may serve to classify the microbatteries, including "Li-free" microbatteries, without being obliged to perform cycling, at the risk of being able to perform the sorting only after the end of the manufacturing process. Specifically, sorting on the basis of cycling requires the microbattery to be encapsulated, either at the wafer or after it is cut and put into a housing, specifically in order to avoid structural changes and sensitivity to air linked to the presence of metallic lithium. Intermediate sorting for reducing manufacturing costs and identifying fault modes is not possible, and this is what it is sought to have in this precise case.

Document U.S. Pat. No. 9,209,496 proposes a sorting method consisting in measuring the open-circuit voltage or OCV of a battery, in discharging it for a certain period and in comparing the end of discharge potential to that of the OCV. It is clear that, in the case of "Li-free" microbatteries, this sorting method is not suitable in that (i) the OCV does not provide any indications regarding the state of the battery, and (ii) discharging "Li-free" batteries does not allow their potential to be modified in a stable manner in that the microbattery is fully discharged at the time of the test.

Document U.S. Pat. No. 6,526,361 proposes a sorting method consisting in applying a plurality of successive pulses (applying either current pulses or voltage pulses) with a relaxation period between each pulse at the batteries, in measuring the associated voltage response and in performing sorting on the basis of this response. This approach is not applicable to "Li-free" microbatteries, given that it requires an initial state that is stable in terms of voltage.

The document "A comparative study of sorting methods for Lithium-ion batteries" by Xiaoyu Li et al, XP032671721 and the document "Fundamentals, impedance, and performance of solid-state LI-metal microbatteries" by Collins John et al, XP012247065 disclose methods for sorting lithium-ion batteries.

In this context and in order to overcome the abovementioned problems, the present invention relates to a testing method that is particularly well-suited to "Li-Free" microbatteries, for which the methods from the known prior art are not compatible. This method makes it possible to perform non-degrading and fast tests, and this method may also be applied to one or a plurality of devices tested in parallel.

SUMMARY OF THE INVENTION

More precisely, the present invention relates to a method for testing at least one energy micro-storage device comprising an anode made of metallic lithium formed by electrodeposition of $Li^+$ ions on a metal inert to lithium ions, an electrolyte and a cathode, said method comprising a sequence of testing steps during the manufacture of said anode, said sequence comprising:

a step of measuring Ph-a the initial voltage OCV of said device in open-circuit mode in order to obtain, at a time t0, the value of the initial voltage of said energy micro-storage device;

if said initial voltage is non-zero, a first charging step Ph-b comprising:
  applying a current Ib for a time tb in order to charge a first portion of said device for a minimum charging time so as to form a first lithium layer thickness at the anode;
  measuring the voltage Vb across the terminals of said device;
the determination of the internal resistance Rb being relative to the state of charge under consideration of said device;
  if the voltage Vb is located within an interval $Vb_{min}$-$Vb_{max}$ defined on the basis of the architecture of the component and if the resistance Rb is located within an interval $Rb_{min}$-$Rb_{max}$ defined on the basis of the architecture of the component, a stabilization step Ph-c comprising:
    continuing to apply at least one current Ic for a time tc in order to charge a second portion of said device for a second charging time tc so as to form a second lithium layer thickness at the anode;
    measuring the voltage Vc across the terminals of said device;
  if the voltage Vc is located within an interval $Vc_{min}$-$Vc_{max}$ defined on the basis of the architecture of the component, a retention step Ph-d comprising:
    applying a zero current for a time td;
    measuring the voltage V across the terminals of the device over time;
    determining the parameter Vd, where $Vd=\Delta V/\Delta t$,
  if Vd is located within an interval $Vd_{min}$-$Vd_{max}$ defined on the basis of the architecture of the component, said device is tested as being valid.

According to some variants of the invention:
the first charging step comprises a series of measurements of voltages Vbi during periods $\Delta tbi$ spaced by times Tbi in order to determine the curve Vbi as a function of time and in order to determine the value of the voltage Vb able to be defined as the maximum value of the voltages Vbi or the average of the voltages Vbi; the resistance Rb may be determined after each time tbi by the ratio Vbi/Ic of the curve Vbi as a function of time t.

According to some variants of the invention, the periods $\Delta tbi$ are of the order of 10 seconds, the times Tbi being of the order of 0.1 second.

According to some variants of the invention, the first thickness is of the order of a few nanometres and preferably from 1 to 2 nanometres.

According to some variants of the invention:
the stabilization step comprises a series of measurements of voltages Vci during periods $\Delta tci$ spaced by times Tci in order to determine the value of the voltage Vc defined as the average of the voltages Vci.

According to some variants of the invention, the periods $\Delta tci$ are of the order of 50 seconds, the times Tci being of the order of 1 second.

According to some variants of the invention, the second thickness is less than 10 nanometres and preferably equal to 5 nanometres.

According to some variants of the invention:
the retention step comprises a series of measurements of voltages Vdi during periods $\Delta tdi$ spaced by times Tdi in order to determine the curve Vdi as a function of time;
the parameter Vd is determined by the gradient of the curve Vdi as a function of time t.

According to some variants of the invention, the periods $\Delta tdi$ are of the order of 10 seconds, the times Tdi being of the order of 1 second.

The invention also relates to a system for testing at least one energy micro-storage device, implementing the testing method of the invention, comprising:
  a current generator connected to said device;
  a voltmeter connected to said device;
  a controller connected to said current generator and to said voltmeter.

According to some variants of the invention, the current generator is programmable and the voltmeter is programmable.

According to some variants of the invention, the controller comprises a timer, a memory and a processor.

The invention also relates to an assembly of a plurality of systems for testing an energy micro-storage device, implementing the method according to the invention, each system comprising:
  a current generator, possibly programmable, connected to said device;
  a voltmeter, possibly programmable, connected to said device,
  each current generator and each voltmeter being connected to a controller.

The invention also relates to an assembly of a plurality of systems for testing an energy micro-storage device, implementing the testing method according to the invention, each system comprising:
  a current generator, possibly programmable, connected to said device;
  a voltmeter, possibly programmable, connected to said device,
  each current generator and each voltmeter being connected to one and the same central controller.

According to some variants of the invention, the testing system is such that each controller or the central controller comprises a timer, a memory and a processor.

The testing system of the invention may comprise a central controller comprising a memory, each controller managing the test phases for each testing system, recording the voltage measurement results in its memory, the central controller recovering said measurement results so as to record them in its memory.

BRIEF DESCRIPTION OF THE DRAWINGS

The invention will be better understood and other advantages will become apparent on reading the description that follows, which is provided without limitation, and by virtue of the appended figures, in which.

DETAILED DESCRIPTION

In general, the testing method proposed in the present invention aims to overcome the various abovementioned drawbacks using a non-degrading and fast testing technique. Advantageously, this technique may be applied to one or a plurality of devices tested in parallel.

The testing method of the invention uses the testing sequence described hereinafter, chaining together the various steps after validating a criterion in the previous step, thus making it possible to conclude as to a faulty device as early as possible.

The energy micro-storage device is hereinafter called a microbattery.

It is described in the context of one example of a lithium-based microbattery comprising a metal anode possibly made of metal, for example made of titanium, and comprises a solid electrolyte possibly for example made of LiPON (lithium phosphorus oxynitride) and a cathode possibly for example made of $LiCoO_2$.

Figure 1:
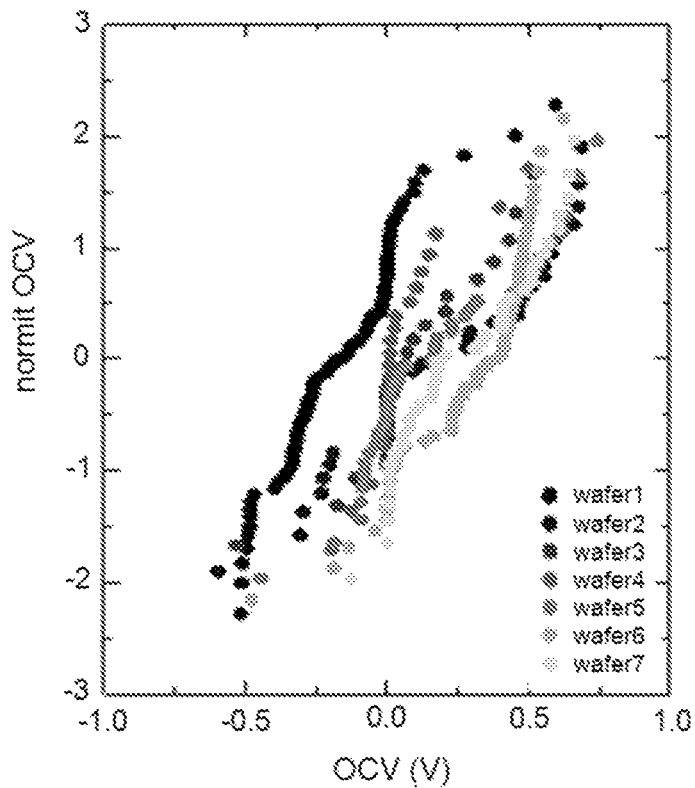
FIG. 1 illustrates variations in the OCV for a microbattery component produced on a batch of 7 wafers, and more precisely a Henry graph, in which the ordinate is the normit function of x, described in detail in the document accessible via the link: http://www.modulad.fr/numero-35/Excelense-grenier-35/DiagrammedeHenry.pdf.
Figure 2:
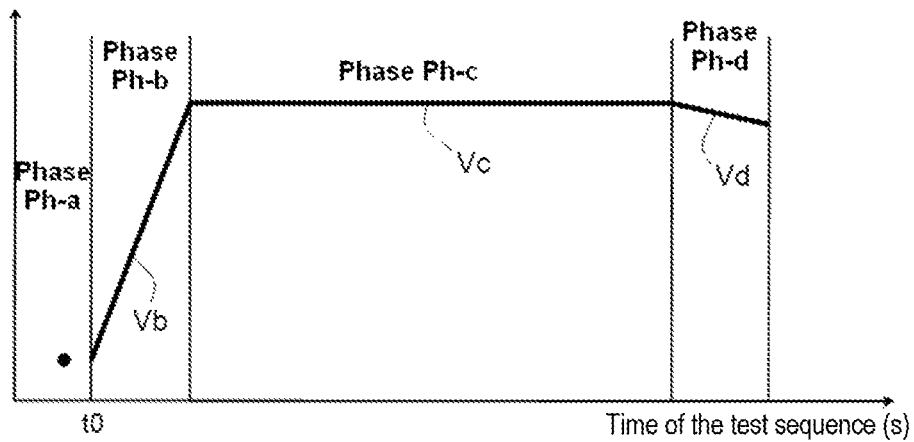
FIG. 2 illustrates the evolution of the voltage across the terminals of a microbattery device as a function of time over all of the steps of the testing method according to the invention.

This technique is advantageous since it applies, for each device under test, four phases that are triggered one after the other when a validation criterion is met. These four phases described hereinafter are called phase of measuring the initial OCV voltage, charging phase, stabilization phase and retention phase. FIG. 2 illustrates the chaining together of these phases by showing the evolution of the voltage across the terminals of the device under test as a function of time in one example of a method described in more detail hereinafter.

Figure 3:
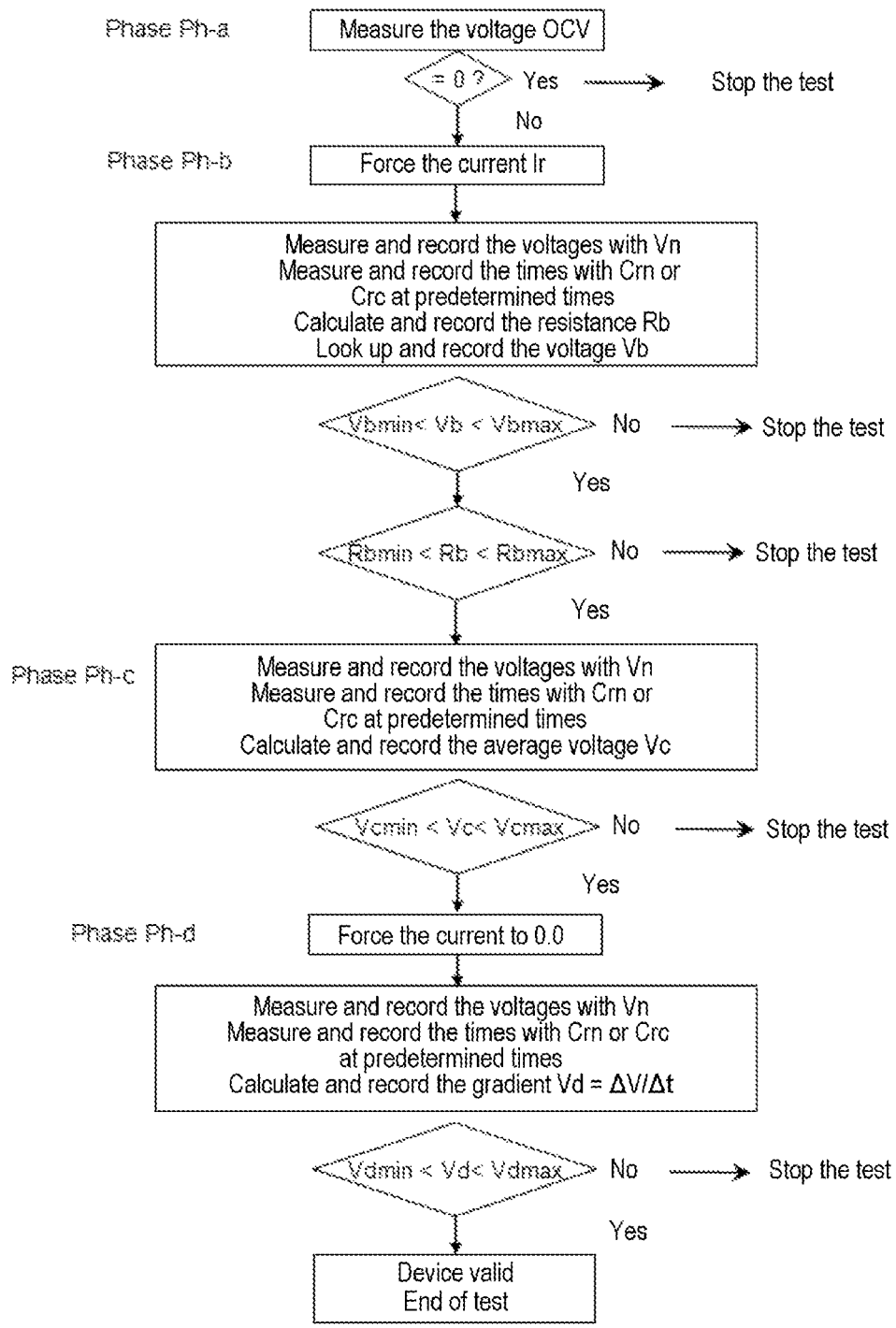
FIG. 3 illustrates a flowchart comprising all of the successive testing phases in the testing method according to the invention.

This sequence of testing phases is described in detail in the remainder of the description and is also illustrated by the flowchart illustrated in FIG. 3.

The testing system is implemented on a device or the plurality of testing systems may be implemented in parallel on a set of devices. The means that are used to implement the testing method of the invention may, according to a first variant of the invention, be the following means, specifically for the testing of each device Dn, only one of these devices Dn being shown in FIG. 4. These means comprise a programmable current generator An, a programmable voltmeter Vn and a controller Cn. The device Dn has an anode connection Dn-Anode and a cathode connection Dn-Cathode, the generator An has a positive connection An-H and a negative connection An-L, and the voltmeter has a positive connection Vn-H and a negative connection Vn-L.

The testing method consists in performing the microbattery device test by connecting the connections An-H of the current generator, Vn-H of the voltmeter and Dn-Anode of the microbattery device together, and the connections An-L of the current generator, Vn-L of the voltmeter and Dn-Cathode of the same microbattery device together. This basic system may be repeated a plurality of times in order to test a plurality of devices.

Figure 4:
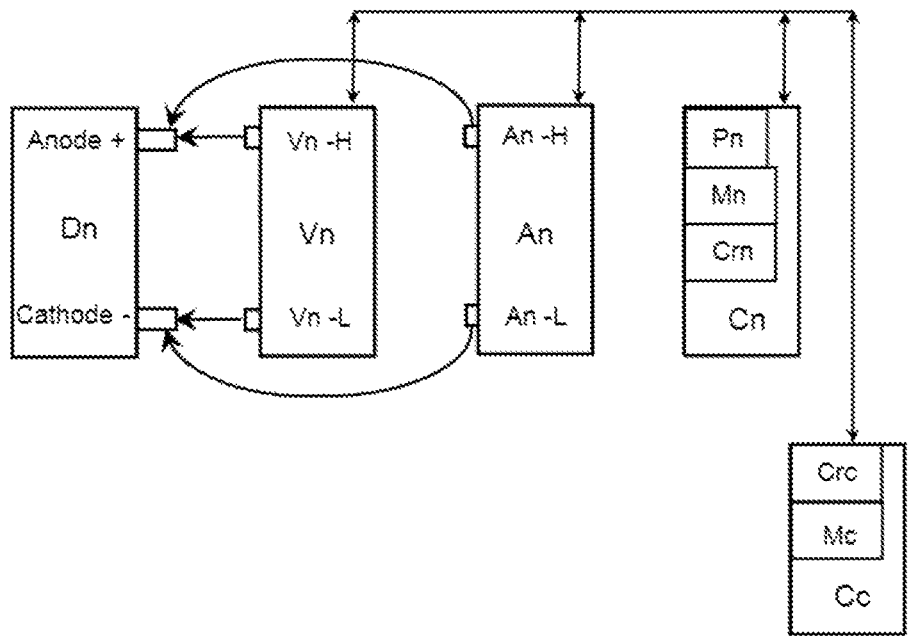
FIG. 4 illustrates one example of a system for testing a plurality of energy micro-storage devices according to the invention, each device being connected to a controller.

Each basic system may be driven by a controller Cn comprising a processor Pn, a timer Crn and a memory Mn, this controller is connected to each voltmeter Vn and each current generator An and becomes an integral part of this system, as also shown in FIG. 4; in this case, all of the controllers Cn of the plurality of testing systems are themselves connected to a central controller Cc in order to drive all of the testing systems. This configuration is advantageous in that the algorithm that is used exhibits better flexibility and easier implementation.

Figure 5:
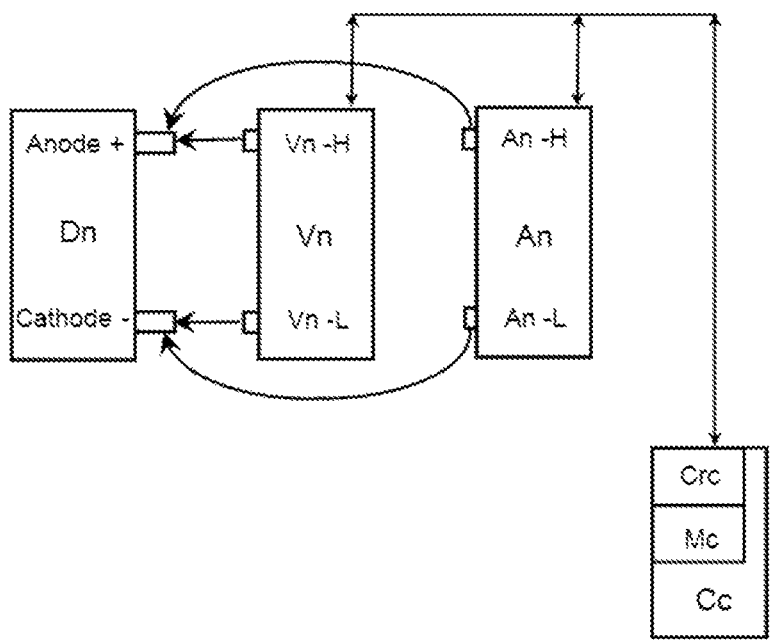
FIG. 5 illustrates one example of a system for testing a plurality of energy micro-storage devices according to the invention, each device being connected to one and the same central controller.

According to another variant of the invention, the plurality of systems may be driven by a central controller Cc comprising a timer Crc and a memory Mc connected to all of the voltmeters Vn and to all of the current generators An, as shown in FIG. 5.

The control means may thus be provided either by a central controller or by a set of individual controllers. In any case, the controller that is used contains, in its memory Mn or Mc, the characteristic times at which the voltage measurements are performed by the voltmeters Vn and the time measurements are performed by the timers Crn or the timer Crc. The controller that is used records these time and voltage measurements in its memory Mn or Mc.

If only the central controller Cc is present, this manages the testing sequences for the plurality of testing systems and records the results of the measurements in its memory Mc; if there is a controller Cn associated with each testing system, each controller Cn manages the testing sequence for each testing system, it records the results of the measurements in its memory Mn, and then the central controller recovers all of the results of the measurements and records them in its memory Mc.

The testing method according to the invention begins with a first phase Ph-a comprising measuring the initial voltage OCV of each device using the voltmeter Vn connected to each device, each of these measurements is recorded in the memory Mn of each controller Cn of each system, or in the memory Mc of the central controller Cc. This first phase makes it possible for example to obtain the parameter OCV (open-circuit voltage) of each device, based on the measurement of this voltage at the time t0. Only the measurement of a value equal to zero is useful in the case of "Li-free" microbatteries, since this represents a fault in short-circuit mode and makes it possible to stop the tests for the components in question. The phase Ph-a carried over to the flowchart of FIG. 3 illustrates this first phase, which may be conclusive and stop the test on a faulty device.

Next, during a second phase called charging phase Ph-b, each current generator An connected to each device Dn applies a current Ib to each device starting from a time t0. This current makes it possible to charge a minimal portion of the device, this having the effect of not damaging the device. More specifically, this operation consists in initiating the migration of Li⁺ ions, and forming a continuous nanometric thickness (for example from 1 to 2 nm) of lithium at the anode, and therefore changing from an "Li-free" to metallic Li configuration, without a structural impact on the component, thereby making it possible to ensure both relevance to a posteriori sorting and the possibility of performing this sorting at any time of the manufacturing process.

This second phase makes it possible for example to obtain the parameter Vb by extracting the maximum voltage obtained from the measurements recorded during this phase. The components are considered to be compliant if the voltage Vb is located within an interval $Vb_{min}$-$Vb_{max}$ defined on the basis of the architecture of the component. The interval $Vb_{min}$-$Vb_{max}$ is defined essentially by the redox couple involved, more specifically by the potential of the cathode (or positive electrode) with respect to an electrode made of metallic lithium. For example, in the case of a cathode made of $LiCoO_2$, this interval will correspond to 3.85-3.89 V, whereas, in the case of a cathode made of $Li_4Ti_5O_{12}$, this interval will correspond to 1.4-1.6 V. The phase Ph-b carried over onto the flowchart of FIG. 3 illustrates this second phase, which may be conclusive and make it possible to continue or to stop the test if the device, not meeting the expected values, is considered to be non-compliant.

Next, during a third phase called stabilization phase Ph-c, the process of the charging phase Ph-b continues with different predetermined times that may be for example times spaced by 1 second for 50 seconds, each current generator An connected to each device Dn continues to apply a current Ic (which may be equal to Ib) to each device Dn. This step aims to adjust the thickness of the nanometric Li layer with respect to the requirements of the electrical tests. Several thicknesses may be beneficial. The maximum sufficient thickness may typically be less than 10 nm, and preferably less than 5 nm. It should be noted that the total thickness of metallic lithium that will be used in the case of complete cycling corresponds to 5000 nm, and the proportion used for the test is around ⅟₁₀₀₀th.

This constitutes a major benefit of the present method, which makes it possible to perform conclusive tests from the beginning of the formation of the metal lithium electrode, and does not require having to finish the manufacturing process in order to be able to test the microbattery device.

This third phase makes it possible for example to obtain the parameter Vc by extracting the average of the values of the voltages obtained from the measurements recorded during this phase. The components are considered to be compliant if the parameter Vc is located within an interval $Vc_{min}$-$Vc_{max}$ defined on the basis of the architecture of the component. The determination of $Vc_{min}$-$Vc_{max}$ is linked essentially to the theoretical variation in the potential of the microbattery following the injection of an amount of charge corresponding to Ic*time. This amount is very low (less than 0.1% of the total amount of charge that the microbattery is able to store) and, in the case of a functional microbattery, the values $Vc_{min}$-$Vc_{max}$ are substantially similar (+/−10%) to the values $Vb_{min}$-$Vb_{max}$. In the case of a non-functional microbattery, the difference between the two potential ranges will be greater. The phase Ph-c carried over onto the flowchart of FIG. 3 illustrates this third phase, which may be conclusive and makes it possible to continue or to stop the test if the device, not meeting the expected values, is considered to be non-compliant.

Other parameters may be contemplated during this phase: for example gradient, or delta V, etc. The value of the gradient $(Vc_{min}$-$Vc_{max})$/Ic makes it possible to give an estimate of the internal resistance of the microbattery at this precise state of charge, and in the same way the difference between $Vc_{min}$ and $Vc_{max}$ or the ratio $V_{cmin}/V_{cmax}$ may provide information about the charging kinetics of the microbattery. Next, during a fourth phase called retention phase Ph-d, each current generator applies a zero current, and the process of the phase Ph-b and of the phase Ph-c continues with predetermined times spaced for example by 1 second for 10 seconds. This fourth phase makes it possible for example to obtain the parameter Vd by extracting the gradient (derivative) of the voltage versus time curve obtained from the measurements recorded during this phase. The components are considered to be compliant if the parameter Vd is located within an interval $Vd_{min}$-$Vd_{max}$ defined on the basis of the architecture of the component. The phase Ph-d contained in the flowchart of FIG. 3 illustrates this fourth phase, which makes it possible to conclude that the device under test is compliant. This phase makes it possible to evaluate the kinetics and the relaxation amplitude of the microbattery following the preceding charging phase. Ideally, the relaxation is limited to a drop in the potential equivalent to Ic*Rint (internal resistance), this value being very low in light of the low current Ic that is used.

Ideally: Vb=Vc=Vd

All of the previously obtained parameters may also be processed using statistical laws in order to characterize the plurality of elements.

The testing method according to the invention is advantageous since it makes it possible to obtain, on devices currently being manufactured (directly on the wafer), a set of parameters characterizing a plurality of devices at a time, if taking the exemplary predetermined values given in phases Ph-a to Ph-d, of 1 minute and 10 seconds, and to do so without being destructive for the devices, subsequently making it possible to finish the manufacturing steps.

The invention claimed is:

1. A method for testing at least one energy micro-storage device comprising an anode made of metallic lithium formed by electrodeposition of Li⁺ ions on a metal inert to lithium ions, an electrolyte and a cathode, wherein said method comprises a sequence of testing steps during the manufacture of said anode, said sequence comprising:
  a step of measuring (Ph-a) the initial voltage (OCV) of said device in open-circuit mode in order to obtain, at a time t0, the value of the initial voltage of said energy micro-storage device;
  if said initial voltage is non-zero, a first charging step (Ph-b) comprising:
    applying a current Ib for a time tb in order to charge a first portion of said device for a minimum charging time so as to form a first lithium layer thickness at the anode;
    measuring the voltage Vb across the terminals of said device;
  determining the internal resistance Rb;
  if the voltage Vb is located within an interval $Vb_{min}$-$Vb_{max}$ defined on the basis of the architecture of the component and if the resistance Rb is located within an interval $Rb_{min}$-$Rb_{max}$ defined on the basis of the architecture of the component, a stabilization step (Ph-c) comprising:

continuing to apply at least one current Ic for a time tc in order to charge a second portion of said device for a second charging time tc so as to form a second lithium layer thickness at the anode;

measuring the voltage Vc across the terminals of said device;

if the voltage Vc is located within an interval $Vc_{min}$-$Vc_{max}$ defined on the basis of the architecture of the component, a retention step (Ph-d) comprising:

applying a zero current for a time td;

measuring the voltage V across the terminals of the device over time;

determining the parameter Vd, where $Vd=\Delta V/\Delta t$, if Vd is located within an interval $Vd_{min}$-$Vd_{max}$ defined on the basis of the architecture of the component, said device is tested as being valid.

2. The testing method according to claim 1, wherein:

the first charging step comprises a series of measurements of voltages Vbi during periods Δtbi spaced by times Tbi in order to determine the curve Vbi as a function of time and in order to determine the value of the voltage Vb able to be defined as the maximum value of the voltages Vbi or the average of the voltages Vbi;

the resistance Rb may be determined after each time tbi by the ratio Vbi/Ic of the curve Vbi as a function of time t.

3. The testing method according to claim 2, wherein the periods Δtbi are of the order of 10 seconds, the times Tbi being of the order of 0.1 second.

4. The testing method according to claim 1, wherein the first thickness is of the order of a few nanometres and preferably from 1 to 2 nanometres.

5. The testing method according to claim 2, wherein:

the stabilization step comprises a series of measurements of voltages Vci during periods Δtci spaced by times Tci in order to determine the value of the voltage Vc defined as the average of the voltages Vci.

6. The testing method according to claim 5, wherein the periods Δtci are of the order of 50 seconds, the times Tci being of the order of 1 second.

7. The testing method according to claim 1, wherein the second thickness is less than 10 nanometres and preferably equal to 5 nanometres.

8. The testing method according to claim 1, wherein:

the retention step comprises a series of measurements of voltages Vdi during periods Δtdi spaced by times Tdi in order to determine the curve Vdi as a function of time;

the parameter Vd is determined by the gradient of the curve Vdi as a function of time t.

9. The testing method according to claim 8, wherein the periods Δtdi are of the order of 10 seconds, the times Tdi being of the order of 1 second.

10. A system for testing at least one energy micro-storage device, implementing a method for testing at least one energy micro-storage device comprising an anode made of metallic lithium formed by electrodeposition of Li⁺ ions on a metal inert to lithium ions, an electrolyte and a cathode, according to claim 1, said testing method comprising a sequence of testing steps during the manufacture of said anode, said sequence comprising:

a step of measuring (Ph-a) the initial voltage (OCV) of said device in open-circuit mode in order to obtain, at a time t0, the value of the initial voltage of said energy micro-storage device;

if said initial voltage is non-zero, a first charging step (Ph-b) comprising:

applying a current Ib for a time tb in order to charge a first portion of said device for a minimum charging time so as to form a first lithium layer thickness at the anode;

measuring the voltage Vb across the terminals of said device;

determining the internal resistance Rb;

if the voltage Vb is located within an interval $Vb_{min}$-$Vb_{max}$ defined on the basis of the architecture of the component and if the resistance Rb is located within an interval $Rb_{min}$-$Rb_{max}$ defined on the basis of the architecture of the component, a stabilization step (Ph-c) comprising:

continuing to apply at least one current Ic for a time tc in order to charge a second portion of said device for a second charging time tc so as to form a second lithium layer thickness at the anode;

measuring the voltage Vc across the terminals of said device;

if the voltage Vc is located within an interval $Vc_{min}$-$Vc_{max}$ defined on the basis of the architecture of the component, a retention step (Ph-d) comprising:

applying a zero current for a time td;

measuring the voltage V across the terminals of the device over time;

determining the parameter Vd, where $Vd=\Delta V/\Delta t$, if Vd is located within an interval $Vd_{min}$-$Vd_{max}$ defined on the basis of the architecture of the component, said device is tested as being valid;

said testing system comprising:

a current generator connected to said device;

a voltmeter connected to said device;

a controller connected to said current generator and to said voltmeter.

11. The testing system according to claim 10, wherein the current generator is programmable and the voltmeter is programmable.

12. The testing system according to claim 10, wherein the controller comprises a timer, a memory and a processor.

13. An assembly of a plurality of systems for testing an energy micro-storage device (Dn), implementing the method according to claim 1, each system comprising:

a current generator (An), possibly programmable, connected to said device (Dn);

a voltmeter (Vn), possibly programmable, connected to said device (Dn), each current generator (An) and each voltmeter (Vn) being connected to a controller (Cn).

14. The assembly of a plurality of systems for testing an energy micro-storage device (Dn), implementing a method for testing at least one energy micro-storage device comprising an anode made of metallic lithium formed by electrodeposition of Li⁺ ions on a metal inert to lithium ions, an electrolyte and a cathode, according to claim 1, said testing method comprising a sequence of testing steps during the manufacture of said anode, said sequence comprising:

a step of measuring (Ph-a) the initial voltage (OCV) of said device in open-circuit mode in order to obtain, at a time t0, the value of the initial voltage of said energy micro-storage device;

if said initial voltage is non-zero, a first charging step (Ph-b) comprising:

applying a current Ib for a time tb in order to charge a first portion of said device for a minimum charging time so as to form a first lithium layer thickness at the anode;

measuring the voltage Vb across the terminals of said device;

determining the internal resistance Rb;

if the voltage Vb is located within an interval $Vb_{min}$-$Vb_{max}$ defined on the basis of the architecture of the component and if the resistance Rb is located within an interval $Rb_{min}$-$Rb_{max}$ defined on the basis of the architecture of the component, a stabilization step (Ph-c) comprising:

continuing to apply at least one current Ic for a time tc in order to charge a second portion of said device for a second charging time tc so as to form a second lithium layer thickness at the anode;

measuring the voltage Vc across the terminals of said device;

if the voltage Vc is located within an interval $Vc_{min}$-$Vc_{max}$ defined on the basis of the architecture of the component, a retention step (Ph-d) comprising:

applying a zero current for a time td;

measuring the voltage V across the terminals of the device over time;

determining the parameter Vd, where $Vd=\Delta V/\Delta t$, if Vd is located within an interval $Vd_{min}$-$Vd_{max}$ defined on the basis of the architecture of the component, said device is tested as being valid;

each system comprising:

a current generator (An), possibly programmable, connected to said device (Dn);

a voltmeter (Vn), possibly programmable, connected to said device (Dn), each current generator (An) and each voltmeter (Vn) being connected to one and the same central controller (Cc).

15. The testing system according to claim 10, wherein each controller or the central controller comprises a timer, a memory and a processor.

16. Testing system according to claim 13, wherein each controller or the central controller comprises a timer, a memory and a processor, further comprising a central controller (Cc) comprising a memory (Mc), each controller (Cn) managing the test phases for each testing system, recording the voltage measurement results in its memory (Mn), the central controller recovering said measurement results so as to record them in its memory (Mc).

\* \* \* \* \*